US012696599B2

(12) United States Patent
Sun et al.

(10) Patent No.: US 12,696,599 B2
(45) Date of Patent: Jul. 28, 2026

(54) LIGHT EMITTING DIODE PACKAGE STRUCTURE, MANUFACTURING METHOD OF LIGHT EMITTING DIODE PACKAGE STRUCTURE AND LIGHT EMITTING PANEL

(71) Applicant: AUO Corporation, Hsinchu (TW)

(72) Inventors: Shuo-Yang Sun, Hsinchu (TW); Hao-Lun Hsieh, Hsinchu (TW); Xiao-Yun Li, Hsinchu (TW); Yu-Hao Chang, Hsinchu (TW); Fu-Yang Chen, Hsinchu (TW); Jhih-Jhu Jhan, Hsinchu (TW); Yu-Chih Wang, Hsinchu (TW); Ying-Hui Lai, Hsinchu (TW)

(73) Assignee: AUO Corporation, Hsinchu City (TW)

( * ) Notice: Subject to any disclaimer, the term of this patent is extended or adjusted under 35 U.S.C. 154(b) by 725 days.

(21) Appl. No.: 17/893,190

(22) Filed: Aug. 23, 2022

(65) Prior Publication Data

US 2023/0064560 A1      Mar. 2, 2023

Related U.S. Application Data

(60) Provisional application No. 63/238,239, filed on Aug. 30, 2021.

(30) Foreign Application Priority Data

Aug. 9, 2022     (TW) .................................. 111129900

(51) Int. Cl.
*H10H 20/857*     (2025.01)
*H10H 20/01*      (2025.01)

(52) U.S. Cl.
CPC .......... *H10H 20/857* (2025.01); *H10H 20/01* (2025.01); *H10H 20/0364* (2025.01)

(58) Field of Classification Search
CPC .. H10H 20/857; H10H 20/01; H10H 20/0364; H10H 20/8506; H10H 20/852;
(Continued)

(56) References Cited

U.S. PATENT DOCUMENTS

| | | | |
|---|---|---|---|
| 10,700,049 B2 | 6/2020 | Lin et al. | |
| 10,886,264 B2 | 1/2021 | Lin et al. | |

(Continued)

FOREIGN PATENT DOCUMENTS

TW          202011535          3/2020

*Primary Examiner* — Eliseo Ramos Feliciano
*Assistant Examiner* — Thaddeus J Kolb
(74) *Attorney, Agent, or Firm* — JCIPRNET

(57)     ABSTRACT

A light emitting diode (LED) package structure includes a first insulating layer, a first conductive pattern, a second insulating layer, a second conductive pattern, an LED element, and a solder material. The first conductive pattern has a first portion and a second portion, the first portion fills a through hole of the first insulating layer, and the second portion is disposed on the first insulating layer. The second insulating layer is disposed on the first insulating layer and covers the first conductive pattern. The second portion of the first conductive pattern is sandwiched between the first insulating layer and the second insulating layer. The second conductive pattern is disposed on the second insulating layer and is electrically connected to the first conductive pattern. The LED element is bonded to the second conductive pattern. The solder material is disposed on the first portion of the first conductive pattern.

14 Claims, 7 Drawing Sheets

(58) Field of Classification Search
CPC .. H10H 20/85; H10H 29/142; H01L 25/0753;
H01L 21/60
See application file for complete search history.

(56) References Cited

U.S. PATENT DOCUMENTS

| | | | | |
|---|---|---|---|---|
| 12,015,111 | B2 * | 6/2024 | Kong | ................. H10H 20/8506 |
| 2011/0201157 | A1 | 8/2011 | Lin et al. | |
| 2020/0075564 | A1 | 3/2020 | Lin et al. | |
| 2020/0220060 | A1 * | 7/2020 | Bang | ................. H10H 20/8512 |
| 2020/0266181 | A1 | 8/2020 | Lin et al. | |
| 2022/0393086 | A1 * | 12/2022 | Tae | ......................... H01L 24/25 |
| 2023/0033767 | A1 * | 2/2023 | Yang | ................. H10H 20/8312 |
| 2024/0105893 | A1 * | 3/2024 | Wang | ........................ G09F 9/00 |
| 2024/0162376 | A1 * | 5/2024 | Nishida | ............. H10H 20/8142 |
| 2024/0258480 | A1 * | 8/2024 | Kim | ....................... H10D 86/00 |
| 2024/0347548 | A1 * | 10/2024 | Bang | ...................... H10D 86/60 |

* cited by examiner $150 \begin{cases} 151 \\ 152 \end{cases}$     $170 \begin{cases} 171 \\ 172 \end{cases}$ $150 \begin{cases} 151 \\ 152 \end{cases}$     $170 \begin{cases} 171 \\ 172 \end{cases}$

100

LIGHT EMITTING DIODE PACKAGE STRUCTURE, MANUFACTURING METHOD OF LIGHT EMITTING DIODE PACKAGE STRUCTURE AND LIGHT EMITTING PANEL

CROSS-REFERENCE TO RELATED APPLICATION

This application claims the priority benefit of U.S. provisional application Ser. No. 63/238,239, filed on Aug. 30, 2021, and Taiwan application serial no. 111129900, filed on Aug. 9, 2022. The entirety of each of the above-mentioned patent applications is hereby incorporated by reference herein and made a part of this specification.

BACKGROUND

Technical Field

The disclosure relates to a light emitting diode (LED) package structure, a manufacturing method of an LED package structure, and a light emitting panel.

Description of Related Art

A light emitting diode (LED) display panel includes a driver back plate and a plurality of LED elements transposed on the driver back plate. With the inherent characteristics of LEDs, the LED display panel has the advantages of economic power consumption, high efficiency, high brightness, and fast response. In addition, compared with an organic LED display panel, the LED display panel further has the advantages of easy color calibration, long luminous lifespan, and no image sticking. Therefore, the LED display panel is regarded as the next generation of display technologies.

In a manufacturing process of the LED display panel, a plurality of LED elements should be transposed onto the driver back plate. In order to improve the transposition yield, the LED elements may be packaged into one LED package structure, and the LED package structure may be transposed onto the driver back plate. During the manufacturing process of the LED package structure, a solder material should be formed on a conductive pattern inside the LED package structure, so as to facilitate the bonding of the LED package structure to the driver back plate. However, in general, the solder material is formed by performing an electroless plating process, during which a thin film internal stress may act on the conductive pattern of the LED package structure, so that the conductive pattern is easily peeled off from the inside of the LED package structure, thus posing a negative impact on the manufacturing yield of the LED package structure

SUMMARY

The disclosure provides a manufacturing method of a light emitting diode (LED) package structure, which may improve a manufacturing yield of the LED package structure.

The disclosure provides an LED package structure with an improved manufacturing yield.

The disclosure provides a light emitting panel with an improved manufacturing yield.

An embodiment of the disclosure provides a manufacturing method of an LED package structure, and the manufacturing method includes following steps. A release layer is formed on a substrate. A first insulating layer is formed on the release layer, where the first insulating layer has a through hole. A first conductive pattern is formed on the first insulating layer, where a first portion of the first conductive pattern fills the through hole of the first insulating layer, and a second portion of the first conductive pattern is disposed on the first insulating layer and is connected to the first portion. A second insulating layer is formed on the first insulating layer to cover the first conductive pattern, where the second portion of the first conductive pattern is sandwiched between the first insulating layer and the second insulating layer. A second conductive pattern is formed on the second insulating layer, where the second conductive pattern is electrically connected to the first conductive pattern. An LED element is bonded to the second conductive pattern. The release layer is separated from the first insulating layer to expose the first portion of the first conductive pattern filling the through hole of the first insulating layer. A solder material is formed on the first portion of the first conductive pattern.

An embodiment of the disclosure provides an LED package structure, and the LED package structure includes a first insulating layer, a first conductive pattern, a second insulating layer, a second conductive pattern, an LED element, and a solder material. The first insulating layer has a through hole. The first conductive pattern has a first portion and a second portion, where the first portion fills the through hole of the first insulating layer, and the second portion is disposed on the first insulating layer and is connected to the first portion. The second insulating layer is disposed on the first insulating layer and covers the first conductive pattern, where the second portion of the first conductive pattern is sandwiched between the first insulating layer and the second insulating layer. The second conductive pattern is disposed on the second insulating layer and electrically connected to the first conductive pattern. The LED element is bonded to the second conductive pattern. The solder material is disposed on the first portion of the first conductive pattern, where the solder material and the second conductive pattern are respectively located on two opposite sides of the first conductive pattern.

An embodiment of the disclosure provides the LED package structure and a driver back plate, where the LED package structure is bonded to the driver back plate.

According to an embodiment of the disclosure, the manufacturing method of the LED package structure further includes following steps. A laser stopper layer is formed on the release layer after the release layer is formed and before the first insulating layer is formed; after the release layer is separated from the first insulating layer, the laser stopper layer is removed to expose the first portion of the first conductive pattern which fills the through hole of the first insulating layer.

According to an embodiment of the disclosure, a projection area of the first conductive pattern is larger than a projection area of the through hole of the first insulating layer, and the projection area of the through hole of the first insulating layer falls within the projection area of the first conductive pattern.

According to an embodiment of the disclosure, the first portion and the second portion of the first conductive pattern define a recess of the first conductive pattern, the second insulating layer has a through hole overlapped with the recess, and the second conductive pattern is electrically connected to the first conductive pattern through the through hole of the second insulating layer.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
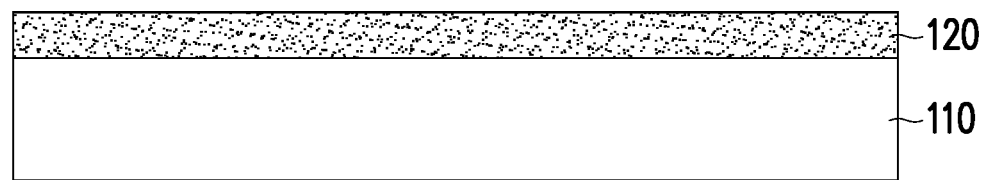
FIG. 1A to FIG. 1M are schematic cross-sectional views illustrating a manufacturing process of a light emitting panel according to an embodiment of the disclosure.

Reference will now be made in detail to the exemplary embodiments of the disclosure, examples of which are illustrated in the accompanying drawings. Whenever possible, the same reference numbers in the drawings and the description serve to denote the same or like parts.

It should be understood that when an element, such as a layer, a film, a region, or a substrate is referred to as being "on" or "connected to" another element, it can be directly on or connected to the another element, or an intermediate element may also be present. By contrast, when an element is referred to as being "directly on" or "directly connected to" another element, no intermediate element is present. As used herein, being "connected" may refer to a physical and/or electrical connection. Furthermore, being "electrically connected" or "coupled" may refer to the presence of other elements between the two elements.

The terminology "about," "approximately," or "substantially" used herein includes the average of the stated value and an acceptable range of deviations from the particular value as determined by those skilled in the art. For instance, the terminology "about" may refer to as being within one or more standard deviations of the stated value, or within ±30%, ±20%, ±10%, or ±5%. Furthermore, the terminology "about," "approximately," or "substantially" as used herein may be chosen from a range of acceptable deviations or standard deviations depending on the optical properties, etching properties, or other properties, rather than one standard deviation for all properties.

Unless otherwise defined, all terminologies (including technical and scientific terminologies) used herein have the same meaning as commonly understood by persons having ordinary skill in the art to which the disclosure belongs. It is understood that these terminologies, such as those defined in commonly used dictionaries, should be interpreted as having meanings consistent with the relevant art and the background or context of the disclosure, and should not be interpreted in an idealized or overly formal way, unless otherwise defined in the embodiments of the disclosure.

FIG. 1A to FIG. 1M are schematic cross-sectional views illustrating a manufacturing process of a light emitting panel according to an embodiment of the disclosure.

With reference to FIG. 1A, a release layer 120 is formed on a substrate 110. In this embodiment, the substrate 110 is transparent and may be penetrated by laser; the release layer 120 may be dissociated by the laser. For instance, in this embodiment, a material of the substrate 110 may include glass, quartz, organic polymer, or other appropriate materials, which should however not be construed as a limitation in the disclosure.

Figure 1B:
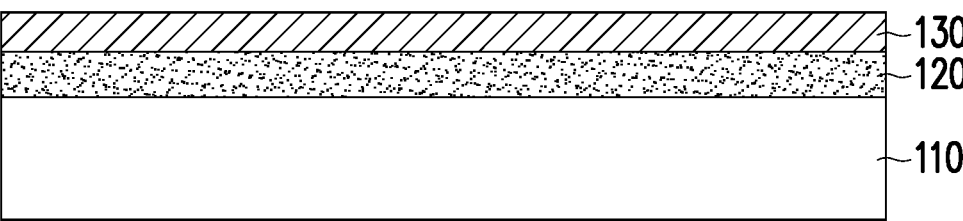

With reference to FIG. 1B, in this embodiment, a laser stopper layer 130 may be selectively formed on the release layer 120. The laser stopper layer 130 may block the laser to prevent the laser from damaging components formed on the laser stopper layer 130 in subsequent manufacturing steps. For instance, in this embodiment, a material of the laser stopper layer 130 may include metal, which should however not be construed as a limitation in the disclosure.

Figure 1C:
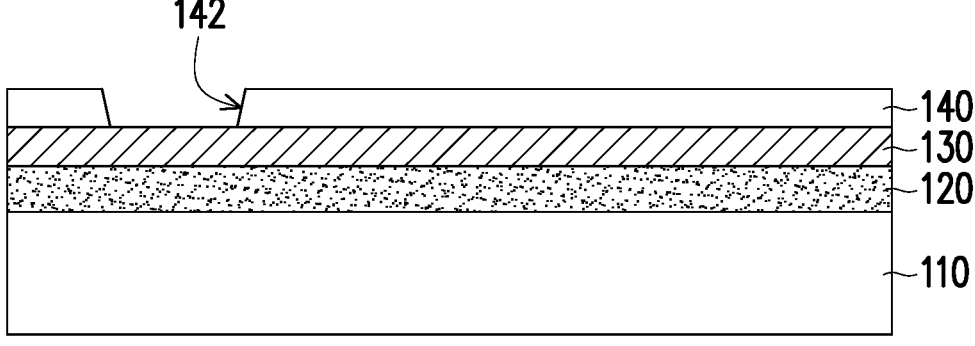

With reference to FIG. 1C, a first insulating layer 140 is formed on the release layer 120, where the first insulating layer 140 has a through hole 142. Specifically, in this embodiment, the first insulating layer 140 may be directly formed on the laser stopper layer 130. However, the disclosure is not limited thereto; in another embodiment, the step of placing the laser stopper layer 130 may be omitted, and the first insulating layer 140 may be directly formed on the release layer 120. A material of the first insulating layer 140 may include an organic material, an inorganic material, or a combination thereof. For instance, in this embodiment, the material of the first insulating layer 140 may be polyimide (PI), which should however not be construed as a limitation in the disclosure.

Figure 1D:
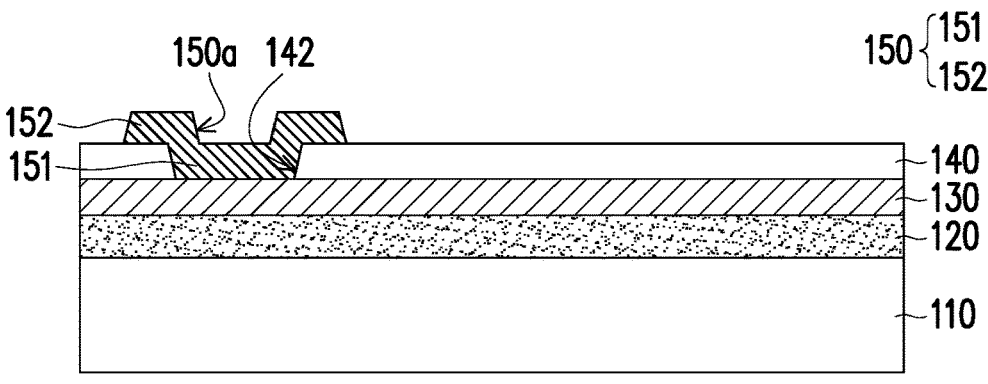

With reference to FIG. 1D, a first conductive pattern 150 is formed on the first insulating layer 140, where a first portion 151 of the first conductive pattern 150 fills the through hole 142 of the first insulating layer 140, and a second portion 152 of the first conductive pattern 150 is disposed on the first insulating layer 140 and connected to the first portion 151. In this embodiment, a projection area of the first conductive pattern 150 is larger than a projection area of the through hole 142 of the first insulating layer 140, and the projection area of the through hole 142 of the first insulating layer 140 falls within the projection area of the first conductive pattern 150. For instance, in this embodiment, a material of the first conductive pattern 150 may include metal, which should however not be construed as a limitation in the disclosure.

In this embodiment, a film thickness T150 of the first conductive pattern 150 may be selectively thin, and the first portion 151 and the second portion 152 of the first conductive pattern 150 may selectively define a recess 150a of the first conductive pattern 150. Here, the recess 150a of the first conductive pattern 150 may be overlapped with the through hole 142 of the first insulating layer 140. However, the disclosure is not limited thereto, and in other embodiments, the film thickness T150 of the first conductive pattern 150 may be thicker, and the first conductive pattern 150 may not have the recess 150a.

Figure 1E:
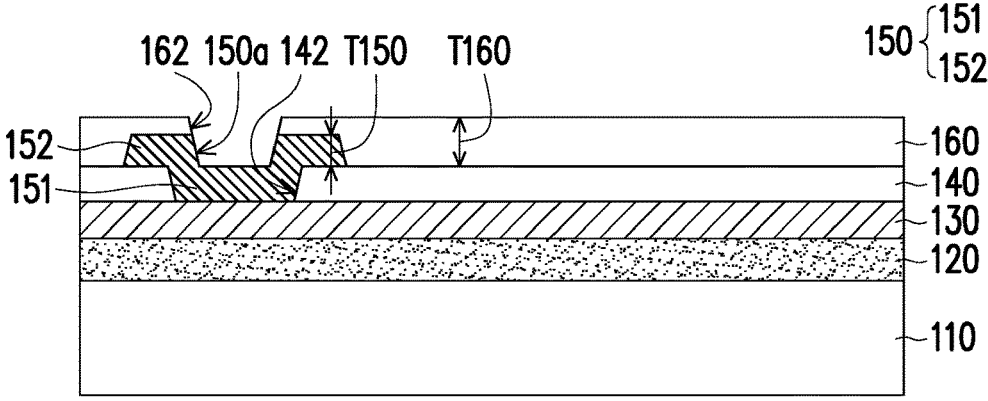

With reference to FIG. 1E, a second insulating layer 160 is formed on the first insulating layer 140 to cover the first conductive pattern 150. The second insulating layer 160 is disposed on the first insulating layer 140 and covers the first conductive pattern 150. In particular, the second portion 152 of the first conductive pattern 150 is sandwiched between the first insulating layer 140 and the second insulating layer 160. A film thickness T160 of the second insulating layer 160 is greater than the film thickness T150 of the first conductive pattern 150, and the first conductive pattern 150 may be well sandwiched collectively by the second insulating layer 160 and the first insulating layer 140.

A material of the second insulating layer 160 may include an organic material, an inorganic material, or a combination thereof. For instance, in this embodiment, the material of the second insulating layer 160 may be PI, which should how-ever not be construed as a limitation in the disclosure.

Figure 1F:
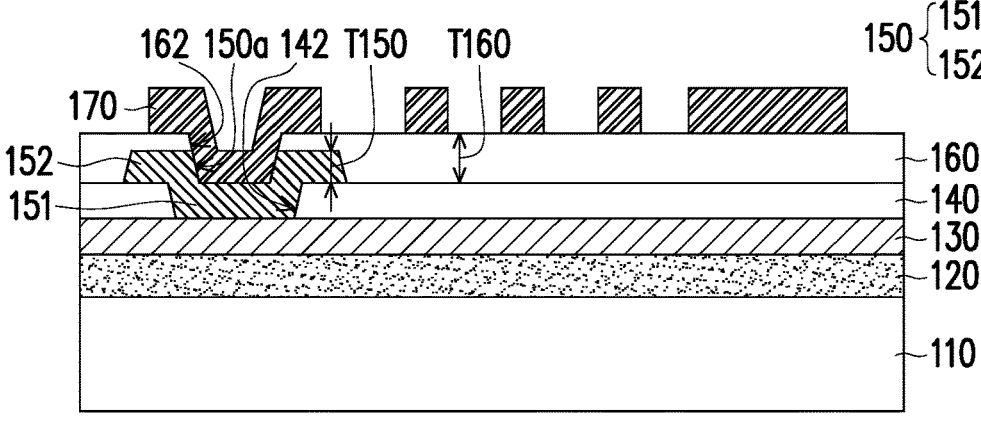

With reference to FIG. 1F, a second conductive pattern 170 is formed on the second insulating layer 160. The second conductive pattern 170 is disposed on the second insulating layer 160, and the second conductive pattern 170 is electrically connected to the first conductive pattern 150. Specifically, in this embodiment, the second insulating layer 160 has a through hole 162, and the second conductive pattern 170 is electrically connected to the first conductive pattern 150 through the through hole 162 of the second insulating layer 160. In this embodiment, the through hole 162 of the second insulating layer 160 may be overlapped with the recess 150a of the first conductive pattern 150, which should however not be construed as a limitation in the disclosure. In this embodiment, a material of the second conductive pattern 170 may include metal, for instance, which should however not be construed as a limitation in the disclosure.

Figure 1G:
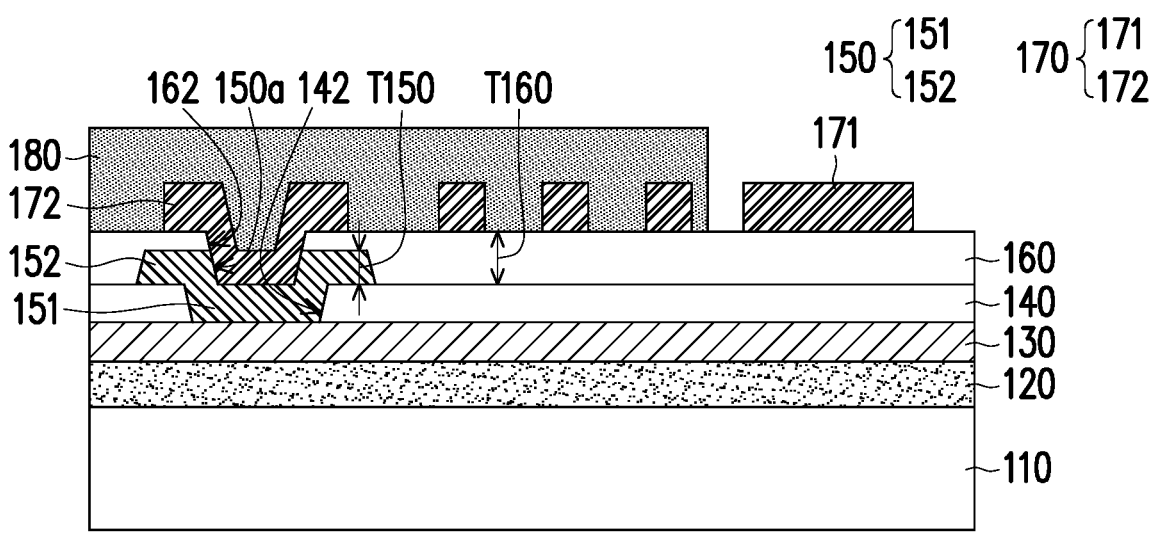

With reference to FIG. 1G, in this embodiment, a light absorbing layer 180 may be selectively formed on the second insulating layer 160 to cover at least one portion of the second conductive pattern 170. Specifically, in this embodiment, the second conductive pattern 170 may include a pad portion 171 and a conductive portion 172 other than the pad portion 171, where the light absorbing layer 180 covers the conductive portion 172 of the second conductive pattern 170 and exposes the pad portion 171 of the second conductive pattern 170. For instance, in this embodiment, a material of the light absorbing layer 180 may include black resin, which should however not be construed as a limitation in the disclosure.

Figure 1H:
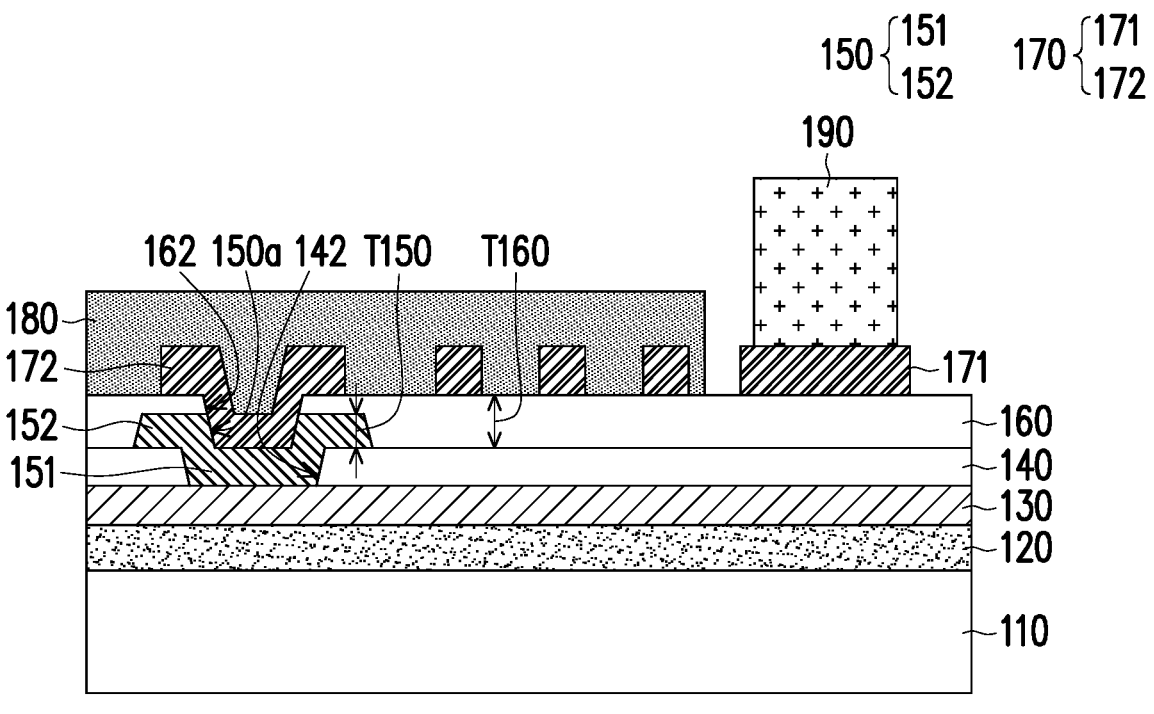

With reference to FIG. 1H, then, an LED element 190 is bonded to the second conductive pattern 170. Specifically, in this embodiment, the LED element 190 is bonded to the pad portion 171 of the second conductive pattern 170 exposed by the light absorbing layer 180. For instance, in this embodi-ment, the LED element 190 is, for instance, a micro-LED (μLED), which should however not be construed as a limitation in the disclosure.

Figure 1I:
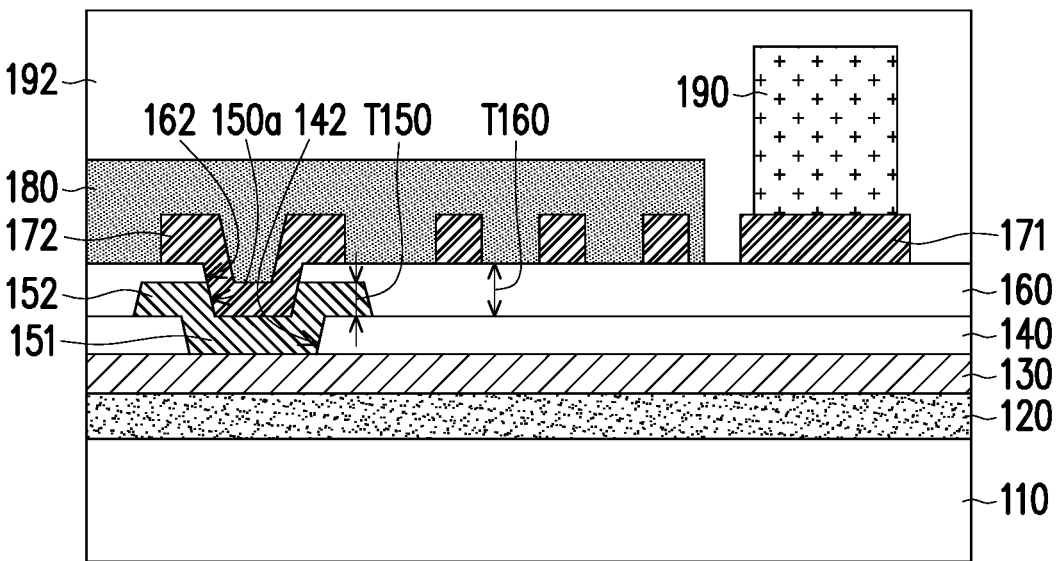

With reference to FIG. 1I, in this embodiment, a trans-parent package layer 192 is formed on the second insulating layer 160 to cover and protect the LED element 190 and the second conductive pattern 170.

Figure 1J:
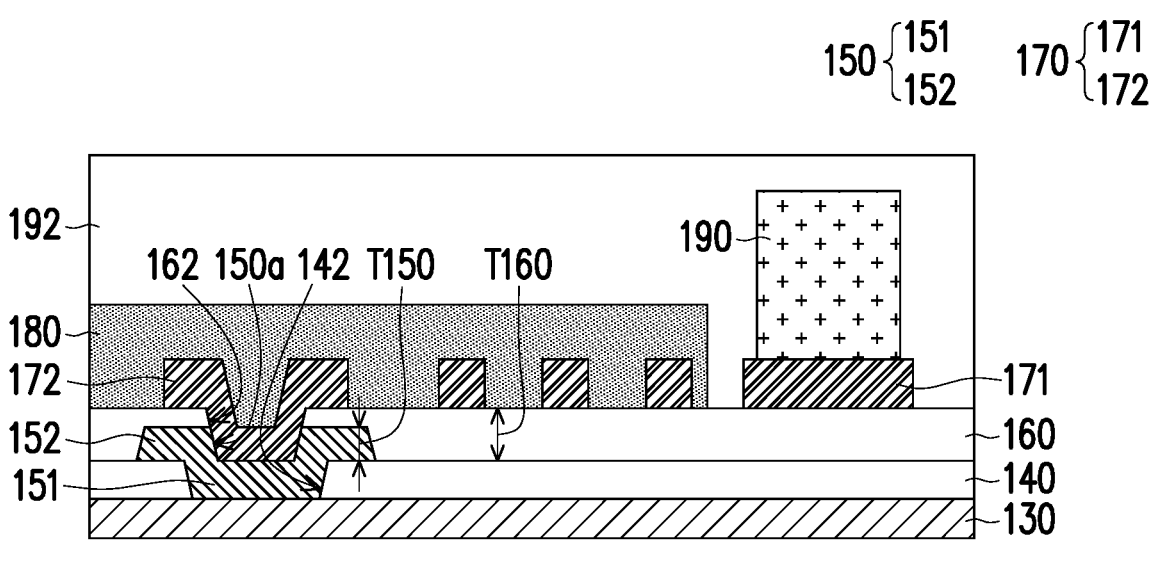
Figure 1K:
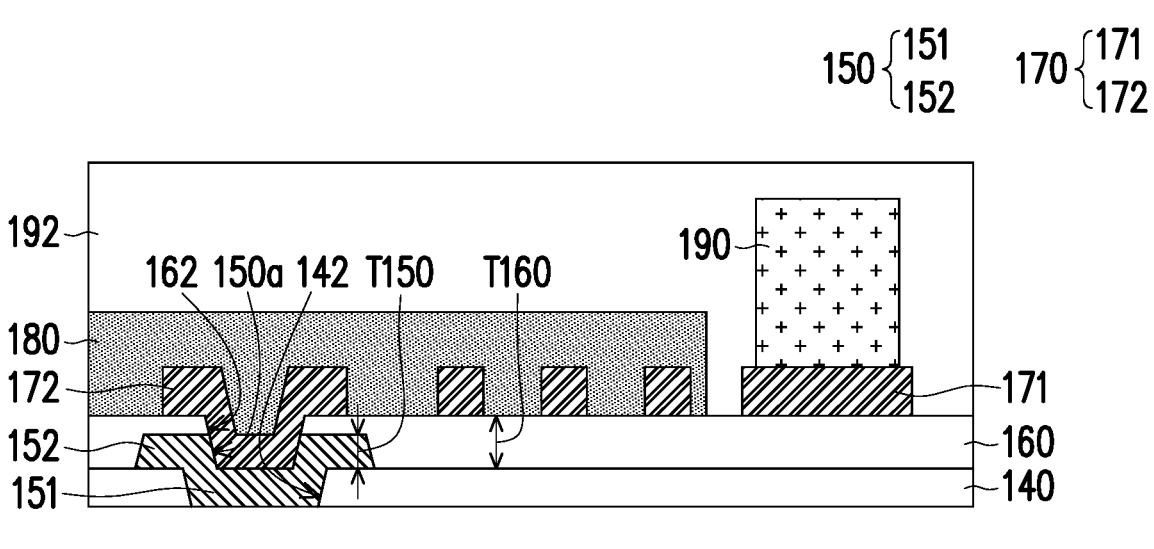

With reference to FIG. 1I, FIG. 1J, and FIG. 1K, the release layer 120 is separated from the first insulating layer 140 to expose the first portion 151 of the first conductive pattern 150 which fills the through hole 142 of the first insulating layer 140. In detail, in this embodiment, a laser de-bonding process may be performed to separate the release layer 120 from the substrate 110; after that, the release layer 120 and the laser stopper layer 130 are removed, so as to expose the first portion 151 of the first conductive pattern 150 filling the through hole 142 of the first insulating layer 140. For instance, in this embodiment, the release layer 120 and the laser stopper layer 130 may be removed by performing an etching process, which should however not be construed as a limitation in the disclosure.

Figure 1L:
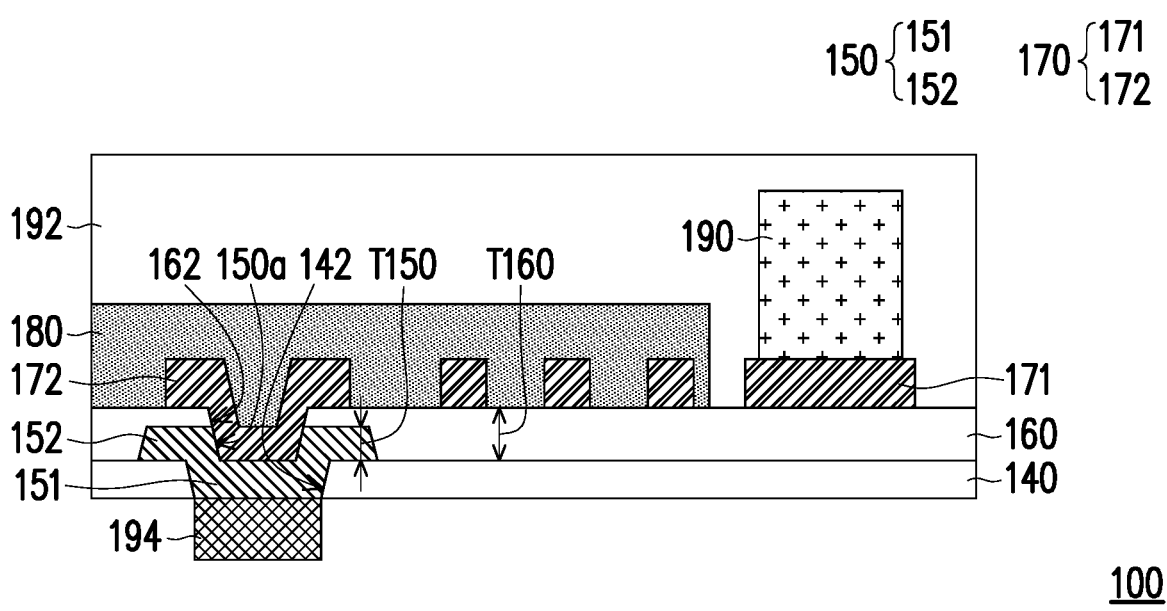

With reference to FIG. 1L, a solder material 194 is formed on the first portion 151 of the first conductive pattern 150. The solder material 194 is disposed on the first portion 151 of the first conductive pattern 150, and the solder material 194 and the second conductive pattern 170 are respectively located on two opposite sides of the first conductive pattern 150. So far, the LED package structure 100 provided in this embodiment is completely formed. For instance, in this embodiment, the solder material 194 may be formed on the first portion 151 of the first conductive pattern 150 by performing an electroless plating process, and the solder material 194 may include nickel and gold, for instance, which should however not be construed as a limitation in the disclosure.

Since the second portion 152 of the first conductive pattern 150 is sandwiched between the first insulating layer 140 and the second insulating layer 160, it should be mentioned that even though there may be a significant difference between a thickness of the solder material 194 and a thickness of the first conductive pattern 150 and a thin film internal stress of the first conductive pattern 150 may be large, the first conductive pattern 150 may not be easily peeled off from the first insulating layer 140 and the second insulating layer 160. Thereby, the manufacturing yield of the LED package structure 100 may be improved.

Figure 2:
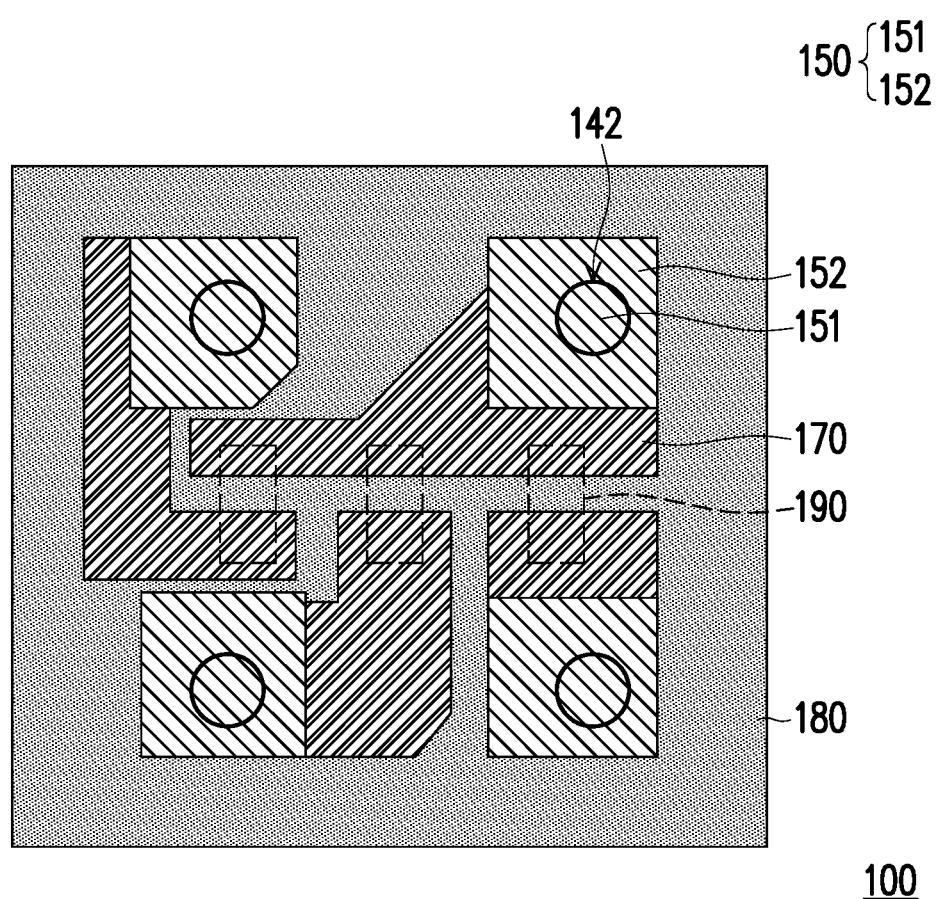
FIG. 2 is a schematic top view illustrating an LED package structure according to an embodiment of the disclosure.

FIG. 2 is a schematic top view illustrating an LED package structure according to an embodiment of the dis-closure. The solder material 194 of the LED package struc-ture 100 is omitted from FIG. 2.

With reference to FIG. 1L and FIG. 2, in this embodiment, one LED package structure 100 may include a plurality of LED elements 190, and the LED elements 190 may be encapsulated by one transparent package layer 192. For instance, in this embodiment, the LED elements 190 of one LED package structure 100 may respectively serve to emit red light, green light, and blue light, which should however not be construed as a limitation in the disclosure.

Figure 1M:
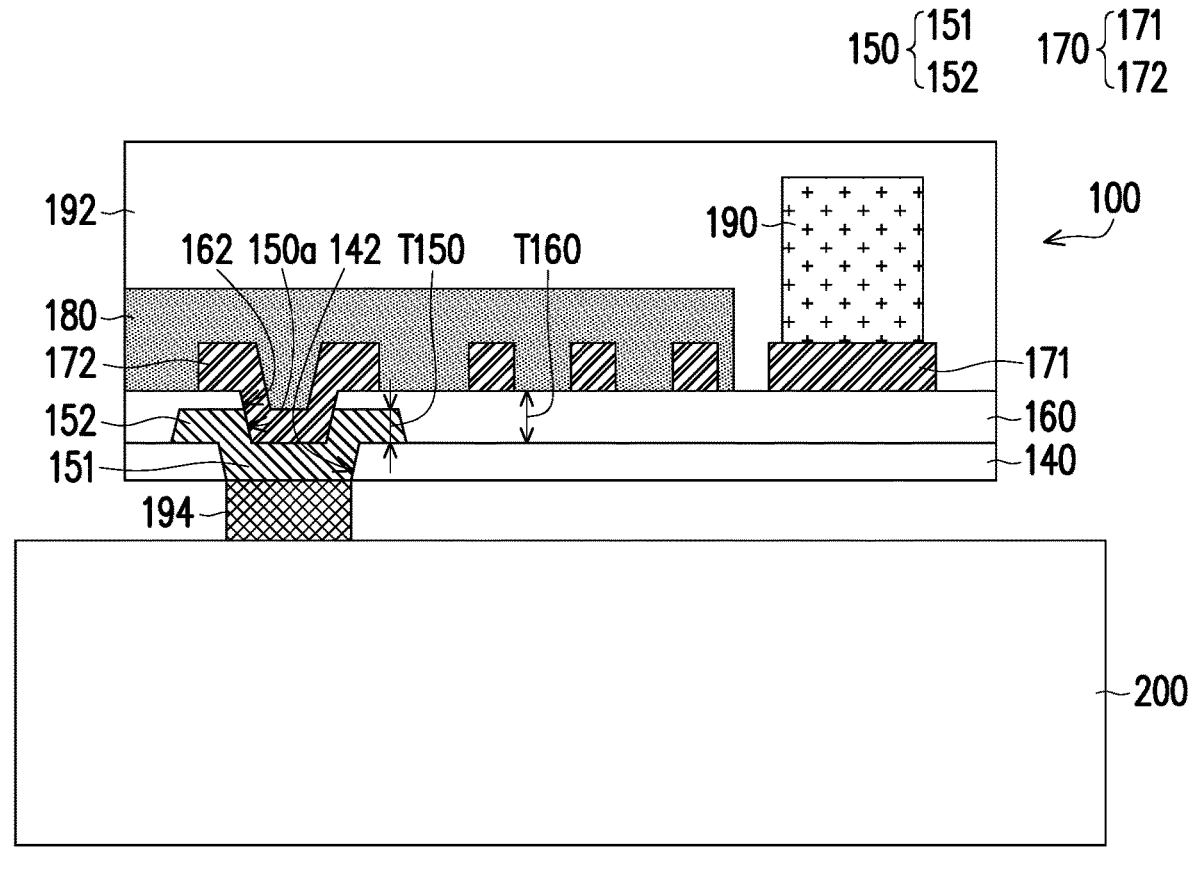

With reference to FIG. 1L and FIG. 1M, the LED package structure 100 is transposed onto a driver back plate 200, and the LED package structure 100 is bonded to the driver back plate 200. So far, the light emitting panel 10 provided in this embodiment is completely formed.

In this embodiment, the driver back plate 200 may include a plurality of sub-pixel driver circuits (not shown), and each of the LED elements 190 is electrically connected to a corresponding one of the sub-pixel driver circuits (not shown). For instance, in this embodiment, each sub-pixel driver circuit may include a data line (not shown), a scan line (not shown), a power line (not shown), a common line (not shown), a first transistor (not shown), a second transistor (not shown), and a capacitor (not shown). A first terminal of the first transistor is electrically connected to the data line, a control terminal of the first transistor is electrically con-nected to the scan line, and a second terminal of the first transistor is electrically connected to a control terminal of the second transistor. A first terminal of the second transistor is electrically connected to the power line, the capacitor is electrically connected to the second terminal of the first transistor and the first terminal of the second transistor. A first electrode (not shown) and a second electrode (not shown) of the LED element 190 may be electrically con-nected to a second terminal of the second transistor and the common line, respectively, which should however not be construed as a limitation in the disclosure.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:
1. A manufacturing method of a light emitting diode package structure, comprising:
   forming a release layer on a substrate;

forming a first insulating layer on the release layer, wherein the first insulating layer has a through hole;

forming a first conductive pattern on the first insulating layer, wherein a first portion of the first conductive pattern fills the through hole of the first insulating layer, and a second portion of the first conductive pattern is disposed on the first insulating layer and is connected to the first portion, and the second portion exposes a portion of a top surface of the first portion to define a recess of the first conductive pattern;

forming a second insulating layer on the first insulating layer and the first conductive pattern, wherein the second portion of the first conductive pattern is ring-shaped, and a portion of the second portion of the first conductive pattern is sandwiched between the first insulating layer and the second insulating layer;

forming a second conductive pattern on the second insulating layer, wherein the second conductive pattern is electrically connected to the first conductive pattern, wherein the second conductive pattern comprises a pad portion and a conductive portion, and a portion of the conductive portion of the second conductive pattern is located in the recess of the first conductive pattern and contacts the portion of the top surface of the first portion;

forming a light absorbing layer on the second insulating layer, wherein the light absorbing layer covers a top surface and a side surface of the conductive portion, and wherein the pad portion of the second conductive pattern is exposed by the light absorbing layer;

bonding a light emitting diode element to the second conductive pattern;

forming a transparent package layer on and contacting the light absorbing layer and the light emitting diode element, wherein the light emitting diode element is encapsulated by the transparent package layer, and wherein a portion of the transparent package layer and a portion of the light absorbing layer are disposed between the pad portion and the conductive portion;

separating the release layer from the first insulating layer to expose the first portion of the first conductive pattern filling the through hole of the first insulating layer; and forming a solder material on the first portion of the first conductive pattern, wherein the solder material and the second conductive pattern are respectively located on two opposite sides of the first conductive pattern, and wherein the solder material is not overlapped with the light emitting diode element and the pad portion.

2. The manufacturing method according to claim 1, further comprising:

forming a laser stopper layer on the release layer after forming the release layer and before forming the first insulating layer; and after separating the release layer from the first insulating layer, removing the laser stopper layer to expose the first portion of the first conductive pattern filling the through hole of the first insulating layer.

3. The manufacturing method according to claim 1, wherein a projection area of the first conductive pattern is larger than a projection area of the through hole of the first insulating layer, and the projection area of the through hole of the first insulating layer falls within the projection area of the first conductive pattern.

4. The manufacturing method according to claim 1, wherein the second insulating layer has a through hole overlapped with the recess of the first conductive pattern, and the second conductive pattern is electrically connected to the first conductive pattern through the through hole of the second insulating layer.

5. A light emitting diode package structure, comprising:

a first insulating layer, having a through hole;

a first conductive pattern, having a first portion and a second portion, wherein the first portion fills the through hole of the first insulating layer, the second portion is disposed on the first insulating layer and is connected to the first portion, and the second portion exposes a portion of a top surface of the first portion to define a recess of the first conductive pattern;

a second insulating layer, disposed on the first insulating layer and the first conductive pattern, wherein the second portion of the first conductive pattern is ring-shaped, and a portion of the second portion of the first conductive pattern is sandwiched between the first insulating layer and the second insulating layer;

a second conductive pattern, disposed on the second insulating layer and electrically connected to the first conductive pattern, wherein the second conductive pattern comprises a pad portion and a conductive portion, and a portion of the conductive portion of the second conductive pattern is located in the recess of the first conductive pattern and contacts the portion of the top surface of the first portion;

a light absorbing layer, disposed on the second insulating layer, wherein the light absorbing layer covers a top surface and a side surface of the conductive portion, and wherein the pad portion of the second conductive pattern is exposed by the light absorbing layer;

a light emitting diode element, bonded to the pad portion of the second conductive pattern;

a transparent package layer, located on and contacting the light absorbing layer and the light emitting diode element, wherein the light emitting diode element is encapsulated by the transparent package layer, and a portion of the transparent package layer and a portion of the light absorbing layer are disposed between the pad portion and the conductive portion; and a solder material, disposed on the first portion of the first conductive pattern, wherein the solder material and the second conductive pattern are respectively located on two opposite sides of the first conductive pattern, and wherein the solder material is not overlapped with the light emitting diode element and the pad portion.

6. The light emitting diode package structure according to claim 5, wherein a projection area of the first conductive pattern is larger than a projection area of the through hole of the first insulating layer, and the projection area of the through hole of the first insulating layer falls within the projection area of the first conductive pattern.

7. The light emitting diode package structure according to claim 5, wherein the second insulating layer has a through hole overlapped with the recess of the first conductive pattern, and the second conductive pattern is electrically connected to the first conductive pattern through the through hole of the second insulating layer.

8. A light emitting panel, comprising:

a light emitting diode package structure, comprising:

a first insulating layer, having a through hole;

a first conductive pattern, having a first portion and a second portion, wherein the first portion fills the through hole of the first insulating layer, the second portion is disposed on the first insulating layer and connected to the first portion, and the second portion exposes a portion of a top surface of the first portion to define a recess of the first conductive pattern;

a second insulating layer, disposed on the first insulating layer and the first conductive pattern, wherein the second portion of the first conductive pattern is ring-shaped, and a portion of the second portion of the first conductive pattern is sandwiched between the first insulating layer and the second insulating layer;

a second conductive pattern, disposed on the second insulating layer and electrically connected to the first conductive pattern, wherein the second conductive pattern comprises a pad portion and a conductive portion, and a portion of the conductive portion of the second conductive pattern is located in the recess of the first conductive pattern and contacts the portion of the top surface of the first portion;

a light absorbing layer, disposed on the second insulating layer, wherein the light absorbing layer covers a top surface and a side surface of the conductive portion, and the pad portion of the second conductive pattern is exposed by the light absorbing layer;

a light emitting diode element, bonded to the pad portion of the second conductive pattern; and a transparent package layer, located on and contacting the light absorbing layer and the light emitting diode element, wherein the light emitting diode element is encapsulated by the transparent package layer, and a portion of the transparent package layer and a portion of the light absorbing layer are disposed between the pad portion and the conductive portion; and a solder material, disposed on the first portion of the first conductive pattern, wherein the solder material and the second conductive pattern are respectively located on two opposite sides of the first conductive pattern, and wherein the solder material is not overlapped with the light emitting diode element and the pad portion; and a driver back plate, wherein the light emitting diode package structure is bonded to the driver back plate.

9. The light emitting panel according to claim 8, wherein a projection area of the first conductive pattern is larger than a projection area of the through hole of the first insulating layer, and the projection area of the through hole of the first insulating layer falls within the projection area of the first conductive pattern.

10. The light emitting panel according to claim 8, wherein the second insulating layer has a through hole overlapped with the recess of the first conductive pattern, and the second conductive pattern is electrically connected to the first conductive pattern through the through hole of the second insulating layer.

11. The light emitting diode package structure according to claim 5, wherein the first insulating layer has a first surface and a second surface, the first portion of the first conductive pattern completely fills within the through hole of the first insulating layer so that a bottom surface of the first conductive pattern and the first surface of the first insulating layer are at a same level, the second portion of the first conductive pattern is disposed on the through hole and the second surface of the first insulating layer, the second insulating layer is disposed on the second surface of the first insulating layer and the first conductive pattern, and the solder material contacts the bottom surface of the first conductive pattern.

12. The light emitting diode package structure according to claim 5, wherein the solder material is disposed on the first portion of the first conductive pattern and adjacent to a first surface of the first insulating layer, and wherein a driver back plate and the first portion of the first conductive pattern are bonded with each other by the solder material so that at least one portion of the first surface of the first insulating layer does not contact the driver back plate.

13. The light emitting panel according to claim 8, wherein the first insulating layer has a first surface and a second surface the first portion of the first conductive pattern completely fills within the through hole of the first insulating layer so that a bottom surface of the first conductive pattern and the first surface of the first insulating layer are at a same level, the second portion of the first conductive pattern is disposed on the through hole and the second surface of the first insulating layer, the second insulating layer is disposed on the second surface of the first insulating layer and the first conductive pattern, and the solder material contacts the bottom surface of the first conductive pattern.

14. The light emitting panel according to claim 8, wherein the solder material is disposed on the first portion of the first conductive pattern and adjacent to a first surface of the first insulating layer, and wherein the driver back plate and the first portion of the first conductive pattern are bonded with each other by the solder material so that at least one portion of the first surface of the first insulating layer does not contact the driver back plate.

* * * * *